United States Patent [19]

Borton et al.

[11] Patent Number: 5,243,292
[45] Date of Patent: Sep. 7, 1993

[54] ELECTROSTATIC MEASURING TUNING FORK AND MEANS FOR LIMITING MECHANICAL AMPLITUDE THEREOF

[75] Inventors: Michael D. Borton, Ontario; William J. Nowak, Webster, both of N.Y.

[73] Assignee: Xerox Corporation, Stamford, Conn.

[21] Appl. No.: 772,721

[22] Filed: Oct. 7, 1991

[51] Int. Cl.⁵ .............................................. G01R 29/12
[52] U.S. Cl. ..................................... 324/458; 84/457; 310/370; 331/156; 333/200
[58] Field of Search ................. 324/457, 458; 84/409, 84/457; 310/370; 333/200; 331/156

[56] References Cited

U.S. PATENT DOCUMENTS

| | | | |
|---|---|---|---|
| 1,637,442 | 8/1927 | Dorsey | 333/200 |
| 2,247,960 | 7/1941 | Michaels | 84/409 |
| 2,806,400 | 9/1957 | Grib | 84/409 X |
| 3,246,259 | 4/1966 | Stanish | 331/126 |
| 3,480,809 | 11/1969 | Grib | 84/409 X |
| 3,621,467 | 11/1971 | Dostal | 331/109 |
| 3,659,230 | 4/1972 | Tanaka et al. | 333/71 |
| 3,852,667 | 12/1974 | Williams et al. | 324/72 |
| 3,887,877 | 6/1975 | Vosteen | 330/10 |
| 3,921,087 | 11/1975 | Vosteen | 330/2 |
| 4,007,432 | 2/1977 | Nakamura | 333/200 |
| 4,025,879 | 5/1977 | Tanaka et al. | 333/200 |
| 4,037,179 | 7/1977 | Terayama | 333/200 |
| 4,069,434 | 1/1978 | Kawai et al. | 310/348 |
| 4,147,981 | 4/1979 | Williams | 324/32 |
| 4,205,267 | 5/1980 | Williams | 324/458 |
| 4,220,885 | 9/1980 | Yamashita et al. | 310/321 |
| 4,270,090 | 5/1981 | Williams | 324/457 |
| 4,339,721 | 7/1982 | Nihira et al. | 324/457 |
| 4,370,616 | 1/1983 | Williams | 324/458 |
| 4,410,827 | 10/1983 | Kogure | 310/370 |
| 4,614,908 | 9/1986 | Daniele et al. | 324/458 |
| 4,763,078 | 8/1988 | Williams | 324/458 |
| 4,797,620 | 1/1989 | Williams | 324/458 |
| 4,853,639 | 8/1989 | Vosteen et al. | 324/457 |
| 4,878,017 | 10/1989 | Williams | 324/109 |
| 4,928,057 | 5/1990 | Williams | 324/72 |

Primary Examiner—Kenneth A. Wieder
Assistant Examiner—Glenn W. Brown
Attorney, Agent, or Firm—Finnegan, Henderson, Farabow, Garrett & Dunner

[57] ABSTRACT

An electrostatic measuring apparatus for measuring unknowns such as the electrostatic potential of a surface in a non-contacting manner, including a tuning fork and a sensing electrode, and in which the frequencies of two different vibration modes of the fork are separated by a slotted supporting structure which is united with the fork, and in which harmful amplitudes of vibration of the fork are avoided by an amplitude limiting structure integral with the sensing electrode. The amplitude limiting structure includes arms extending around the ends of the tines.

10 Claims, 5 Drawing Sheets

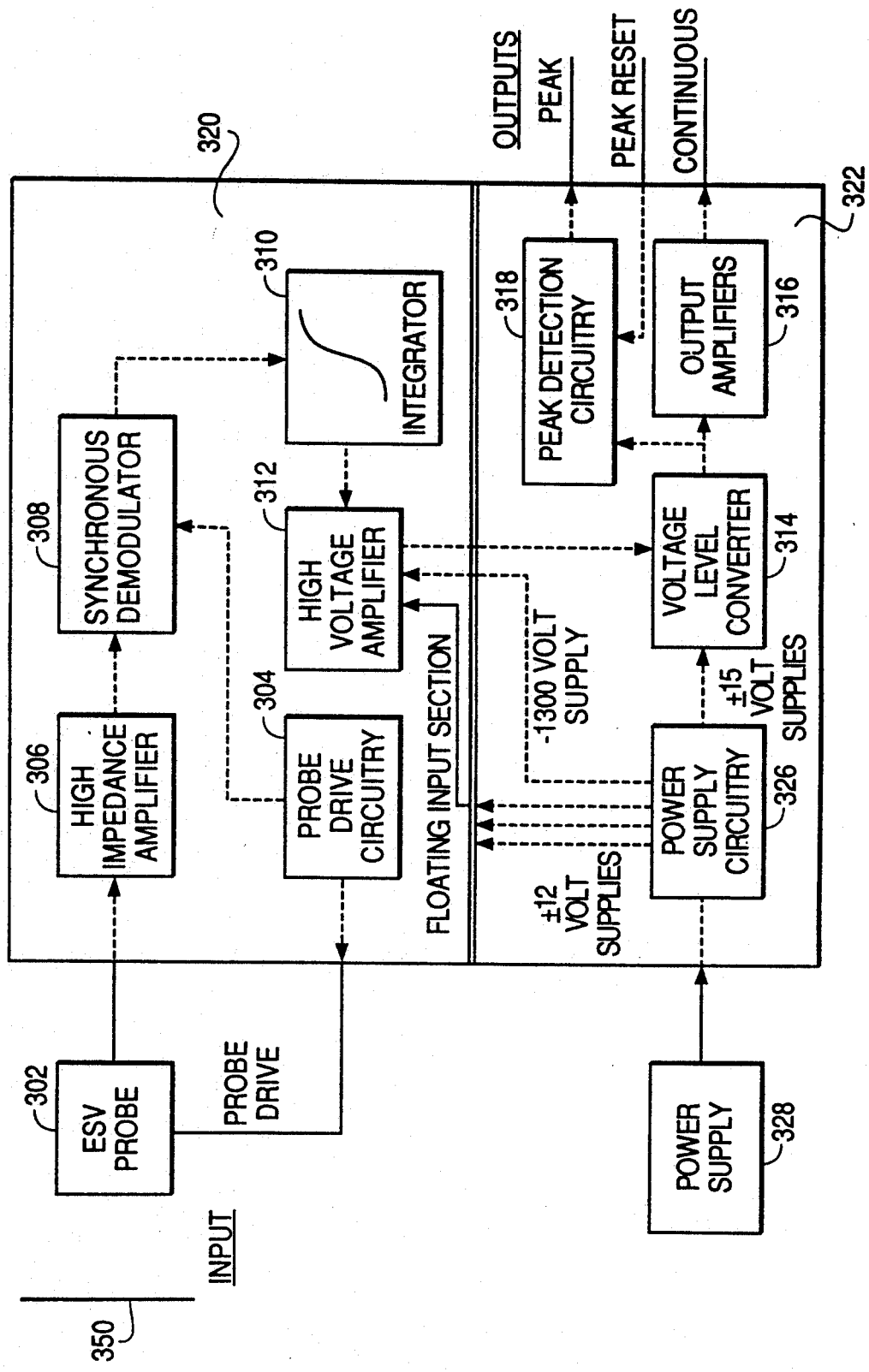

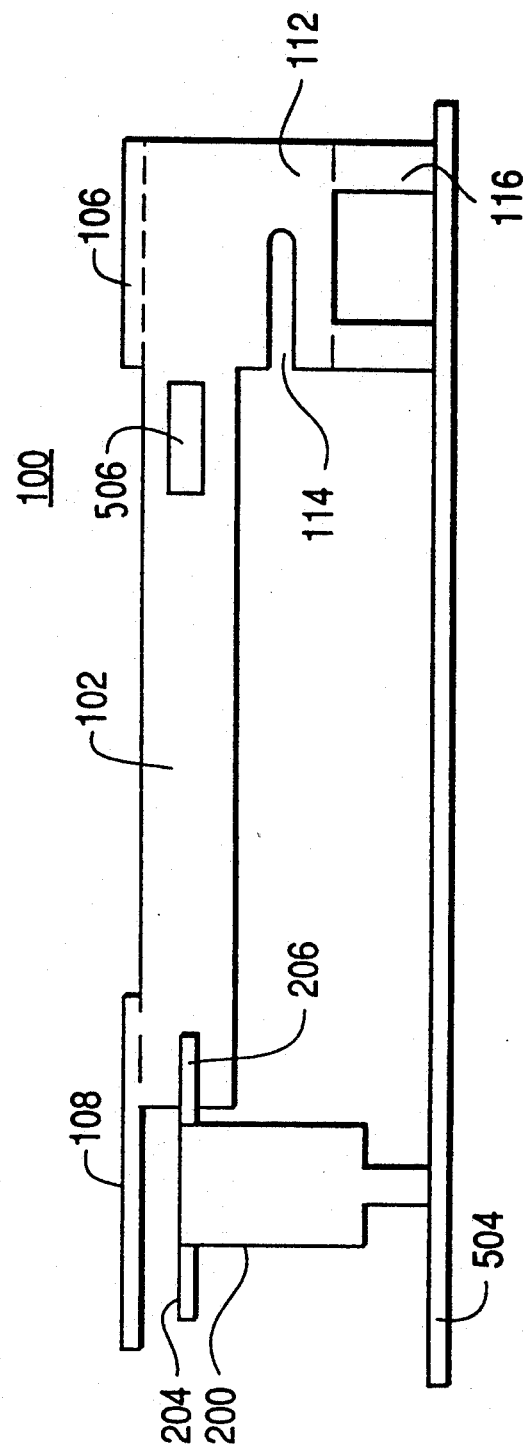

ELECTROSTATIC MEASURING TUNING FORK AND MEANS FOR LIMITING MECHANICAL AMPLITUDE THEREOF

BACKGROUND OF THE INVENTION

1. Field of the Invention

This invention relates to an improved electrostatic potential sensor using a tuning fork with associated tines. More particularly, this invention relates to an electrostatic potential sensor with improved resistance to mechanical shock and vibration and a reduced probability of operating in undesirable mechanical modes.

2. Discussion of the Related Art

Conventional electrostatic potential sensors employ a tuning fork with a pair of thin vibrating tines and a sensing electrode. The tines are configured with a relatively thin dimension and are caused to vibrate in a plane perpendicular to that dimension. The tines are interposed between the sensing electrode and the surface under test or within the electrostatic field under test.

The tines have two distinct modes of vibration. In the first mode, both tines move in unison away from and then move in unison toward a line centered between the tines. In the second mode, one tine moves toward the center line while the other tine moves away from the center line.

In the conventional electrostatic measuring apparatus, the tines on the tuning fork are caused to operate in the first mode such that the tines alternately couple and decouple the sensing electrode and the surface having an unknown quantity to be measured with the electrode. In response to the described oscillation of the tines, an AC voltage proportional to the difference between the voltage on the object under test and the voltage on the tines is induced on the sensing electrode.

The tuning fork in the conventional measuring apparatus is typically constructed with a configuration such that the tuning fork is comprised of two support legs connected to a fork root, with two tines extending from the fork root and a vane further extending from the end of each tine opposite the fork root. The vanes are typically oriented with their largest flat surfaces perpendicular to the largest flat surfaces of the tines.

The tuning fork is attached to the base of a probe by the two support legs with the tines extending parallel to the base of the probe. The electrode, which is constructed with two legs supporting a rectangular platform, is placed on the base of the probe directly under the vanes of the tuning fork with the platform being parallel to the base of the probe. Piezo electric crystals, which drive the fork, are typically mounted on the tines between the fork root and the vanes.

The connection of a conventional electrostatic measuring apparatus as an electrostatic voltmeter or field meter is shown in U.S. Pat. No. 3,921,087 issued to Vosteen. Vosteen concerns a capacitive modulator having a tuning fork with associated tines which are interposed between a sensitive electrode and a quantity being measured. A driver vibrates the tuning fork to cause the tines to oscillate in opposite phase at equal amplitude to vary the coupling relationship between the sensitive electrode and the quantity being measured. A corresponding voltage which may be processed to provide a measurement of the unknown quantity being measured is thereby induced on the sensitive electrode. Associated circuitry comprising a preamplifier and signal amplifier are connected to the sensitive electrode to obtain desired amplification of the signal induced thereon. The tuning fork is driven by an electromechanical driver connected to a reference oscillator, and therefore, detector signals induced on the sensitive electrode as a result of coupling to the unknown quantity being measured are modulated at the frequency of the reference oscillator. Additionally, the reference oscillator supplies signals to a phase sensitive detector which also receives the output of the signal amplifier to cause demodulation of the modulated detector signals induced on the sensitive electrode. An integrating amplifier is connected to the output of the phase sensitive detector to amplify the output thereof and a voltage indicator is connected to the output of the integrating amplifier to provide measurement of the unknown quantity under test.

The conventional measuring apparatus has suffered from several problems. Being an electromechanical device, the electrostatic measuring apparatus is sensitive to mechanical shock and vibration which may damage the piezo electric crystals which serve as mechanical driving elements. In particular, when the conventional apparatus is dropped, the mechanical shock produced causes the tines to vibrate substantially beyond their normal operating amplitude, thereby cracking the piezo electric crystals and rendering the device inoperative. Further, the mechanical shock tends to bend the support legs of the fork forward such that the tines contact the electrode, thereby rendering the device inoperative.

The conventional sensor additionally suffers from the difficulty of operating improperly due to vibration occurring at the corner of the end of each tine opposite the attached vane and farthest from the fork root. These vibrations may prevent the tuning fork in the sensor from operating in the desired mode.

SUMMARY OF THE INVENTION

The present invention has been made in view of the above circumstances and has as an object to provide an electrostatic measuring apparatus which is resistant to damage from mechanical shock and substantially free from misoperation due to vibration of the ends of the tuning fork tines nearest the fork root.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the electrostatic measuring apparatus of this invention comprises a sensing electrode; a tuning fork having two tines and a fork root, each tine having a vane extending from an end of the tine and interposed between the sensing electrode and the surface to be measured, and means for supporting the tines and fork root, the supporting means being connected to the tines and having four support legs; and means for vibrating the tuning fork at a predetermined frequency.

BRIEF DESCRIPTION OF THE DRAWINGS

The accompanying drawings, which are incorporated in and constitute a part of this specification illustrate embodiments of the invention and, together with the description, serve to explain the objects, advantages and principles of the invention. In the drawings.

FIG. 3 is a block diagram of the tuning fork/sensing electrode configuration of the preferred embodiment of the present invention in a probe assembly ha associated circuitry to function as a non-contacting DC electrostatic voltmeter;

FIG. 5 is a side view of the tuning fork and sensing electrode of the preferred embodiment mounted on a base.

DETAILED DESCRIPTION OF THE PREFERRED EMBODIMENTS

Figure 1A:
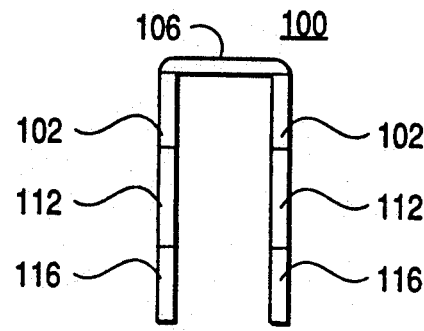
FIGS. 1(a) through 1(c) are front, side and top views, respectively, of a tuning fork of the preferred embodiment of the present invention.

Reference will now be made to the presently preferred apparatus incorporating the invention as illustrated in the accompanying drawings, in which like reference characters designate like or corresponding parts throughout the several drawings.

An electrostatic measuring apparatus according to the present invention comprises a tuning fork and a sensing electrode. As can be seen in FIGS. 1(a), (b), and (c), the tuning fork 100 of the measuring apparatus of this embodiment comprises two tines 102, each having one end connected to a fork root 106 and the opposing end connected to vanes 108. Each of the vanes 108 is connected to the respective tines 102 so that the longest vane dimension runs parallel to the longest tine dimension and the thinnest vane dimension runs perpendicular to the thinnest tine dimension. The fork root and tines are supported by two support elements 112, each attached to a tine and each having a slot 114 in its width and two legs 116 extending away from the fork root.

Figure 2C:
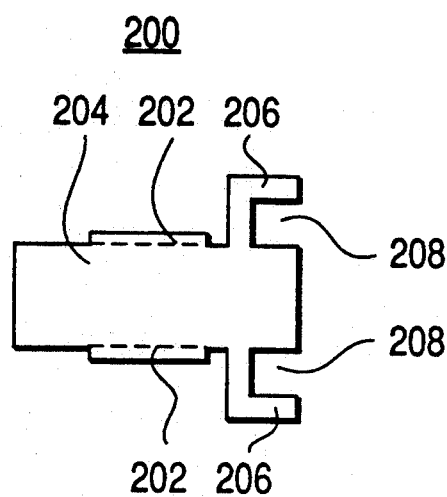
FIGS. 2(a) through 2(c) are front, side, and top views of a sensing electrode of a preferred embodiment of the present invention.
Figure 2B:
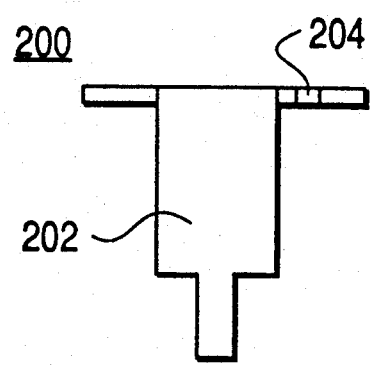
Figure 2A:
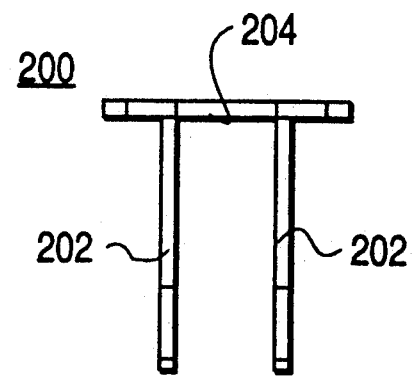
Figure 4A:
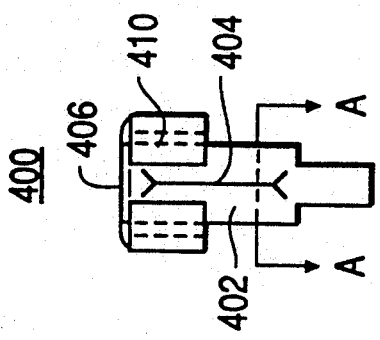
FIGS. 4(a) through 4(d) are front, side, top, and cross-sectional views, respectively, of a second embodiment of the tuning fork of the present invention.
Figure 4D:
Figure 4B:
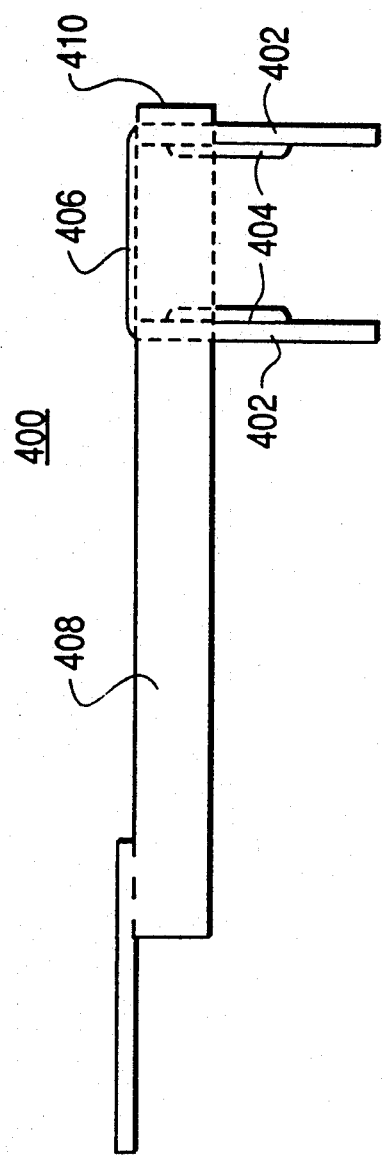
Figure 4C:
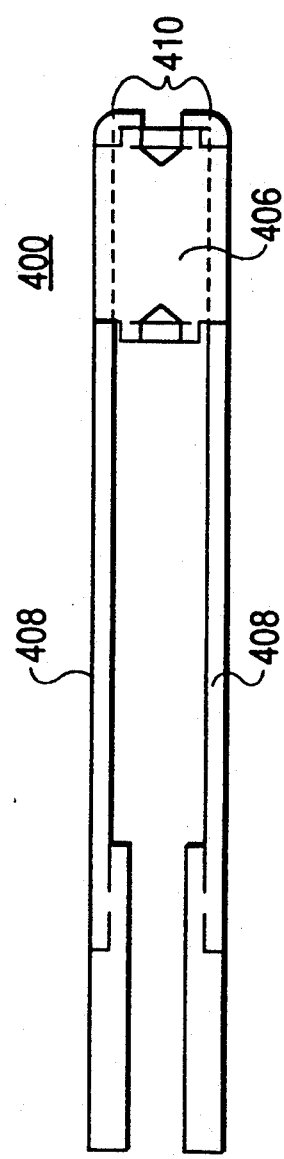

The sensing electrode 200, as shown in FIGS. 2(a), (b), and (c), is constructed with two legs 202 connected to opposite sides of a rectangular platform 204 with the legs centered along the length of the platform 204. The platform 204 has an arm 206 protruding perpendicular from each side having an attached leg at a point between the edge of the leg and end of the platform and then extending parallel to the side with the attached leg, thereby forming a notch 208.

The positioning of the tuning fork 100 and the sensing electrode 200 with respect to each other in this preferred embodiment of the potential sensor is shown in FIG. 5. The tuning fork 100 is mounted on a base 504 with the four legs 116 of the fork perpendicular to the base 504 and with the tines 102 of the fork extending parallel to the base 504. The sensing electrode 200 is mounted on the base 504 directly under the vanes 108 of the fork 100 with the platform 204 of sensing electrode 200 extending between the tines 102 of the fork 100 and the arms 206 of the sensing electrode 200 extending outside of the tines 102 such that the end of each tine 102 to which a vane 108 is attached is disposed in the center one of the two notches 208.

Piezo electric crystals 506 are mounted on the tines 102 of the tuning fork near the fork root 106. One of the piezo electric crystals supplies the mechanic means of developing motion in the fork and the other crystal senses the motion of the fork. The tuning fork is driven at its resonant frequency in which it exhibits simple harmonic motions, in which the tines move in unison away from a line centered between the tines and move in unison toward the center line. During normal operation of the sensor, the tines vibrate freely within the notches 208 without contacting either the platform or the arms of the sensing electrode 200. However, the notches 208 are formed having a width only slightly larger than that necessary to allow the tines to vibrate freely during normal operation of the device so that the platform 204 and the arms 206 will serve as mechanical stops preventing the tines 102 from vibrating far beyond their normal amplitude. With this construction, the crystals 506 are protected from the damage due to mechanical shock that plagues conventional devices.

The four legs 116 on the tuning fork allow for better orientation of the tuning fork when mounting the fork 100 on a base 504 and improve the fork's resistance to bending forward or backward when subjected to mechanical shock.

The two support elements 112 of the fork 100 solve the difficulty of the device operating improperly due to vibration of the lower corner of each tine 102 opposite the attached vane 108 and furthest from the fork root 106 by connecting the corner of the tine 102 to the base 504 through support elements 112 and the support legs 116.

If a tuning fork constructed with the elements included in the tuning fork 100 of the preferred embodiment was provided but without the slots 114 in the support elements 112, desirable and undesirable modes of operation of the tuning fork are very close together in frequency, thereby causing instability of a system employing the tuning fork. The slots 114 in the support elements 112 of the tuning fork 100 cause desirable and undesirable modes of operation of the tuning fork to be separated by a large frequency difference and therefore eliminate the instability problem.

Figure 1B:
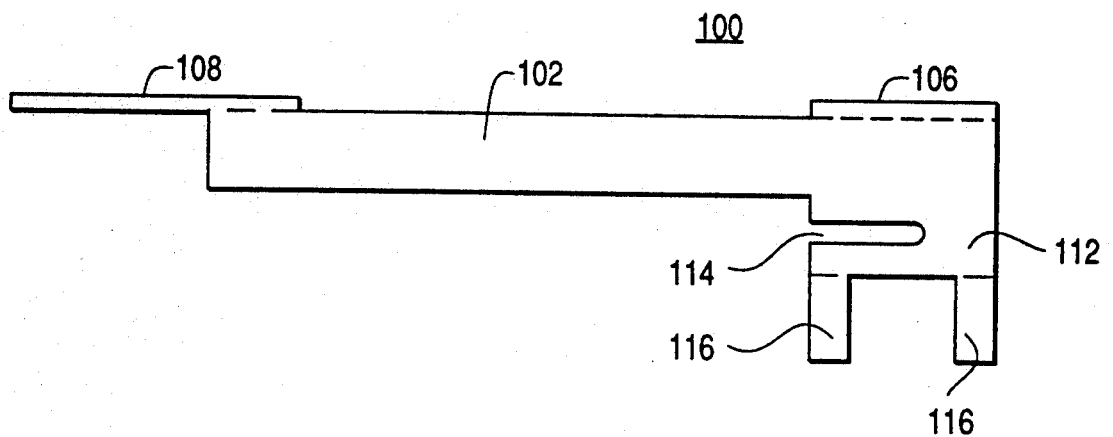
Figure 1C:
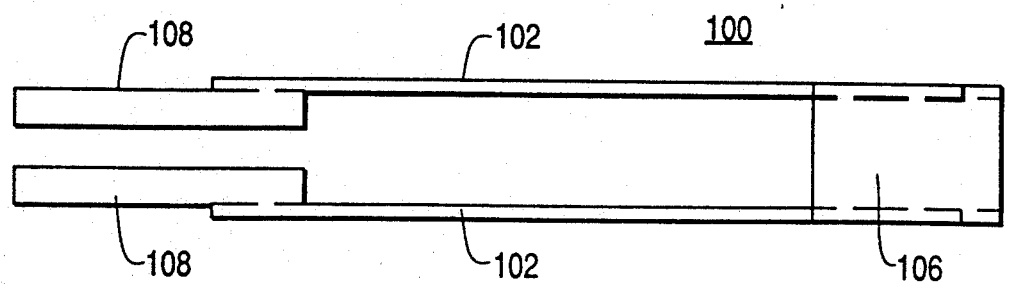

FIG. 3 further shows the connection of the potential sensor of the first preferred embodiment of the present invention having associated circuitry to function as a non-contact, full feedback electrostatic voltmeter. The probe assembly 302 comprises an integral housing which contains the tuning fork 100 (FIG. 1), the sensing electrode 200 (FIG. 2), and a high impedance amplifier (not shown). The housing comprises conductive material to provide an isolated environment for the probe assembly 302, in association with a feedback connection. The high impedance amplifier comprises a J-FET transistor employed in the source follower mode.

The circuitry of the electrostatic voltmeter is divided into a floating input section 320 and a power supply/signal conditioning circuitry section 322 which are isolated from each other. The floating input section 320 includes probe drive circuitry 304, a high impedance amplifier 306, a synchronous demodulator 308, an integrator 310, and a high voltage amplifier 312. The probe drive circuitry 304 drives the tuning fork at its resonant frequency of approximately 520 Hz. If the potential of the sensing electrode 200 is different than the potential of the surface 350 it is viewing, an AC signal at 520 Hz is induced through the sensing electrode 200 into the input of a high impedance amplifier 306. The output of the high impedance amplifier 306 is an AC signal having an amplitude proportional to the difference in potential and distance between the sensing electrode 200 and the surface being measured 350.

The output of the high impedance amplifier 306 is connected to the synchronous demodulator 308 which employs the 520 Hz tuning fork drive signal supplied from the probe drive circuitry 304 as a reference signal. During one half cycle of the drive signal, the circuit of the synchronous demodulator 308 is a non-inverting amplifier with unity gain. During the next half cycle, the circuit of the synchronous demodulator 308 acts as an inverting amplifier with unity gain. The drive signal is slightly phase shifted to bring the inverting-to-non-inverting transition closer to the zero crossing point of the AC signal. The resulting output of the synchronous demodulator 308 is a full wave rectified waveform whose amplitude is proportional to the difference between the voltage of the probe 302 and the voltage of the test surface 350 and whose effective DC polarity is indicative of the polarity difference between the probe and the surface being measured. If there is no difference in potential, the output of the synchronous demodulator 308 is zero volts.

The output of the synchronous demodulator 308 is connected to the integrator 310, which filters out the 520 Hz AC signal and generates an error signal as an output. Any nonzero signal received from the synchronous demodulator 308 will cause the integrator 310 to output a change in direction necessary to reduce the signal output from the synchronous demodulator 308. The rate of change is determined by the gain of the integrator 310 and the amplitude of the signal received from the synchronous demodulator 308. If the signal received from the synchronous demodulator 308 is zero, the output of the integrator 310 is constant. The error signal from the integrator 310 is connected to the input of a high voltage amplifier 312, having a gain of about $-200$.

The output of the high voltage amplifier 312 is connected to the power supply common (not shown) of the floating input section 320. Therefore, the probe assembly 302 and the entire floating input section ride on this changing output. When the output of the high voltage amplifier 312 equals the voltage on the test surface 350, the output of the probe 302 is zero, and the integrator 310 holds a constant value, thereby maintaining the proper high voltage amplifier output. Any change in voltage on the test surface 350 will produce a reaction from the circuit to effect a change toward a zero output from the probe 302.

The output of the high voltage amplifier 312 contains the desired information. This output of the high voltage amplifier 312 must be conditioned to be usable and compatible with other devices. Thus, the power supply/signal conditioning circuitry section 322 includes power supplies 326, a voltage level converter 314, output amplifiers 316, and peak detection circuitry 318. The output of the high voltage amplifier 312 is connected to a continuous monitor, comprising voltage level converter 314 and output amplifiers 316, acting as an inverting amplifier with a gain of 0.008. The gain is set by the voltage level converter 314, which acts as a high impedance precision voltage divider having a total resistance of approximately 10 megohms, and output amplifiers 316. For a 100 volt change on the high voltage amplifier 312, there will be a corresponding change of 0.8 volts on the continuous monitor output. The continuous monitor includes an adjustable voltage reference which serves to offset the continuous monitor output by 1.0 volts. Thus, with 0 volts on the test surface, the output of the continuous monitor will be 1.0 volt, and with $-1000$ volts on the test surface, the output of the continuous monitor will be 9.0 volts. Any test surface potential between 0 and $-1000$ volts can be measured in the same way.

There are many xerographic applications for the electrostatic voltmeter. Since the desired information in many of these applications is the peak potential on the test surface 350 during a particular interval of time, a resetable peak detector 318 is included in the electrostatic voltmeter. The output of the voltage level converter 314 is connected to peak detection circuitry 318.

The power source for the electrostatic voltmeter is a 24 volt DC power supply 328. The power supply circuitry 326 generates a floating $\pm 12$ volt supply to the floating input section 320, a $\pm 15$ volt supply for the output amplifier 316, and $+60$ and $-1200$ volt supplies for the high voltage amplifier 312.

A second embodiment of the invention is shown in FIGS. 4(a)–4(d) differs from the previously described embodiment only in the design of the tuning fork. In the second embodiment of the invention, the tuning fork 400, shown in FIG. 4(a), (b), (c), and (d), has two support legs 402, each having a bend 404 in the direction dimension which is perpendicular to a fork root 406 to stiffen the legs, connected to the fork root 406 between two tines 408 near one end of the tines 408. A short portion 410 of each tine 408 extending beyond the fork root 406 is bent at a right angle so that the short portion 410 is parallel to the support legs 402.

The bend in the short portion 410 of the tine 408 stiffens the corner of the tine 408 nearest the support legs 402 and farthest from fork root 408 so as to eliminate the unwanted vibrations occurring in that portion that plagued the conventional models. The bend 404 in each support leg 402 strengthens the fork and improves resistance to damage due to mechanical shock.

The foregoing description of the preferred embodiments of the invention have been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. An electrostatic measuring apparatus for measuring an electrostatic potential of a surface in a non-contacting manner, comprising:
a tuning fork having a fork root, two tines connected to said fork root, each of said tines having a length and a width, said lengths of said tines being substantially parallel with each other and said widths of said tines being substantially parallel with each other, each of said tines having a vane extending from an end of said tine, and means for supporting each of said tines and said fork root, said supporting means being connected to said tines and having four support legs extending substantially perpendicular to the lengths of said tines, and said supporting means including means for establishing a large frequency difference between a first fundamental frequency at which said tuning fork vibrates in a desirable mode from a second fundamental frequency at which said tuning fork vibrates in an undesirable mode; and means for vibrating said tuning fork at a predetermined frequency.

2. An electrostatic measuring apparatus for measuring an electrostatic potential of a surface in a non-contacting manner, comprising:

a tuning fork having a fork root, two tines connected to said fork root, and means for supporting each of said tines and said fork root, each of said tines having a vane extending from an end of said tine, and said supporting means being connected to said tines and having four support legs extending substantially perpendicular to the lengths of said tines, wherein said supporting means includes means for establishing a large frequency difference between a first fundamental frequency at which said tuning fork vibrates in a desirable mode from a second fundamental frequency at which said tuning fork vibrates in an undesirable mode; and means for vibrating said tuning fork at a predetermined frequency.

3. An electrostatic measuring apparatus according to claim 2, wherein the supporting means includes two support elements, each of said support elements being connected to one of said tines and two of said support legs; and said means for establishing a large frequency difference between said first and second fundamental frequencies comprises a slot in each of said support elements, said slot in each support element being disposed between the tine and the first leg connected to said support element.

4. An electrostatic measuring apparatus for measuring an electrostatic potential of a surface in a non-contacting manner, comprising:

an electrode for detecting a voltage, said electrode including means for mechanically limiting an amplitude of vibration of said tines of a tuning fork to a predetermined amplitude;

said tuning fork having a fork root, two tines connected to said fork root, each of said tines having a vane extending from an end of said tine; each of said tines being interposed between said electrode and said surface, and means for supporting each of said tines and said fork root, said supporting means being connected to said tines and having four support legs; and means for vibrating said tuning fork at a predetermined frequency.

5. An electrostatic measuring apparatus according to claim 4, wherein said amplitude limiting means comprises two notches formed by said electrode for receiving ends of said tines.

6. An electrostatic measuring apparatus according to claim 5, wherein said notches are formed by arms extending from said electrode.

7. An electrostatic measuring apparatus for measuring an electrostatic potential of a surface in a non-contacting manner, comprising:

a tuning fork having two tines; and an electrode for detecting a voltage, said electrode including means for mechanically limiting an amplitude of vibration of said tines to a predetermined amplitude.

8. An electrostatic measuring apparatus for measuring an electrostatic potential of a surface in a non-contacting manner, comprising:

a tuning fork having two tines;

an electrode for detecting a voltage, said electrode including means for mechanically limiting an amplitude of vibration of said tines to a predetermined amplitude; and means for vibrating said tuning fork at a predetermined frequency.

9. An electrostatic measuring apparatus according to claim 8, wherein said amplitude limiting means comprises two notches formed by said electrode for receiving ends of said tines.

10. An electrostatic measuring apparatus according to claim 9, wherein said notches are formed by arms extending from said electrode.

* * * * *